US006925464B2

(12) United States Patent
Kurupati

(10) Patent No.: US 6,925,464 B2
(45) Date of Patent: Aug. 2, 2005

(54) METHOD AND SYSTEM FOR PERFORMING INSERTS AND LOOKUPS IN MEMORY

(75) Inventor: Sreenath Kurupati, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 500 days.

(21) Appl. No.: 10/172,564

(22) Filed: Jun. 13, 2002

(65) Prior Publication Data

US 2003/0233358 A1 Dec. 18, 2003

(51) Int. Cl.[7] .................................................. G06F 17/30

(52) U.S. Cl. ............................. 707/6; 707/10; 711/210; 711/216

(58) Field of Search ................................ 711/210, 216; 707/6, 1, 102

(56) References Cited

U.S. PATENT DOCUMENTS 4,152,762 A * 5/1979 Bird et al. .................. 711/108
6,023,466 A * 2/2000 Luijten et al. ......... 370/395.31
6,415,354 B1 * 7/2002 Joffe et al. .................. 711/108
6,546,391 B1 * 4/2003 Tsuruoka ........................ 707/8
6,564,211 B1 * 5/2003 Andreev et al. ............... 707/3
6,571,313 B1 * 5/2003 Filippi et al. ............... 711/108
6,611,832 B1 * 8/2003 van Lunteren ................. 707/3
6,639,819 B2 * 10/2003 Uzawa et al. ................. 365/49
6,691,218 B2 * 2/2004 Brown ....................... 711/216
2002/0143787 A1 * 10/2002 Knee et al. ................. 707/102

OTHER PUBLICATIONS

Pending U.S. Appl. No. 10/232,985, titled Method and Apparatus for High–Speed Longest Prefix Match of Keys in a Memory by Miguel A. Guerrero filed Aug. 30, 2002.

* cited by examiner

*Primary Examiner*—Luke S Wassum
*Assistant Examiner*—Susan F. Rayyan
(74) *Attorney, Agent, or Firm*—Blakely, Sokoloff, Taylor & Zafman LLP

(57) ABSTRACT

A method and system for performing inserts and lookups in fully associative sections of memory is provided. The system includes a differentiating register to store information that differentiates entries in a section of a memory, logic coupled to the register to determine which entry is most likely to match a search key, and a comparator to compare the search key to the entry determined most likely to match. For each pair of entries in the section of memory, a differentiating bit position, reference value, and pointer are determined and stored to differentiate the entries. A search key can be compared to the differentiating values to determine which entry is most likely to match. Then, the entry determined most likely to match is retrieved from memory and compared to the search key.

29 Claims, 5 Drawing Sheets determining differentiating values 300 storing the differentiating values 302 comparing a search key to the differentiating values to determine a likely best match entry 304 comparing the search key to the likely best match entry 306

METHOD AND SYSTEM FOR PERFORMING INSERTS AND LOOKUPS IN MEMORY

BACKGROUND

1. Field

Embodiments of the invention relate to the field of memory, and more specifically to performing inserts and lookups in memory.

2. Background Information and Description of Related Art

To enable faster lookups in a memory, several algorithms group a number of entries into a section. An original search key is then compared with each entry in the section in a single lookup. If the comparisons to each entry are performed sequentially, the lookup is slow, since it takes a number of cycles to traverse all the entries. If the comparisons to each entry are performed in parallel, the logic needed to implement the parallel comparison of each entry with the search key takes more chip area and is relatively costly.

An alternative method is to sort the entries in a section and store discriminant bits that differentiate the sorted entries. This method allows for fast lookups but puts a penalty on inserts, since inserts may require the entries to be resorted. For example, for each insert into a section with N number of entries, if the entries are resorted, there will be N memory reads and N memory writes required.

BRIEF DESCRIPTION OF DRAWINGS

The invention may best be understood by referring to the following description and accompanying drawings that are used to illustrate embodiments of the invention. In the drawings.

DETAILED DESCRIPTION

Embodiments of a system and method for performing inserts and lookups in memory are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
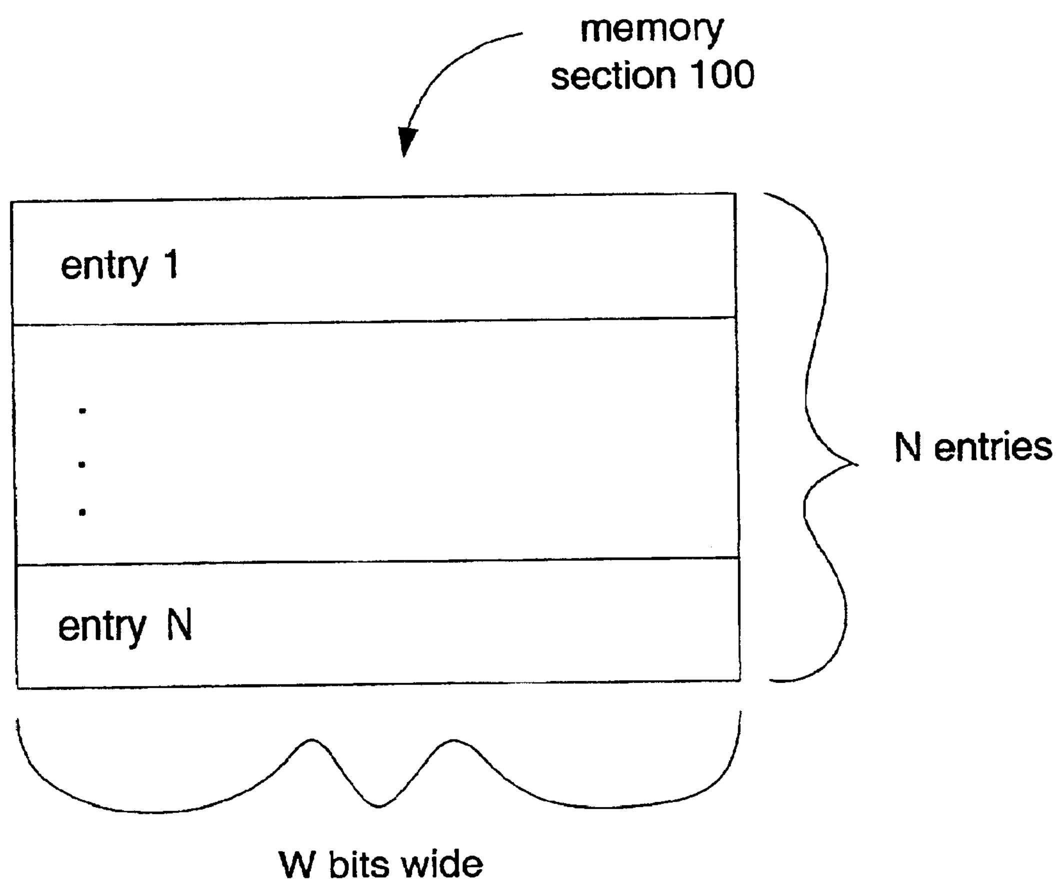
FIG. 1 illustrates a memory section implementing an embodiment of the invention.
Figure 2:
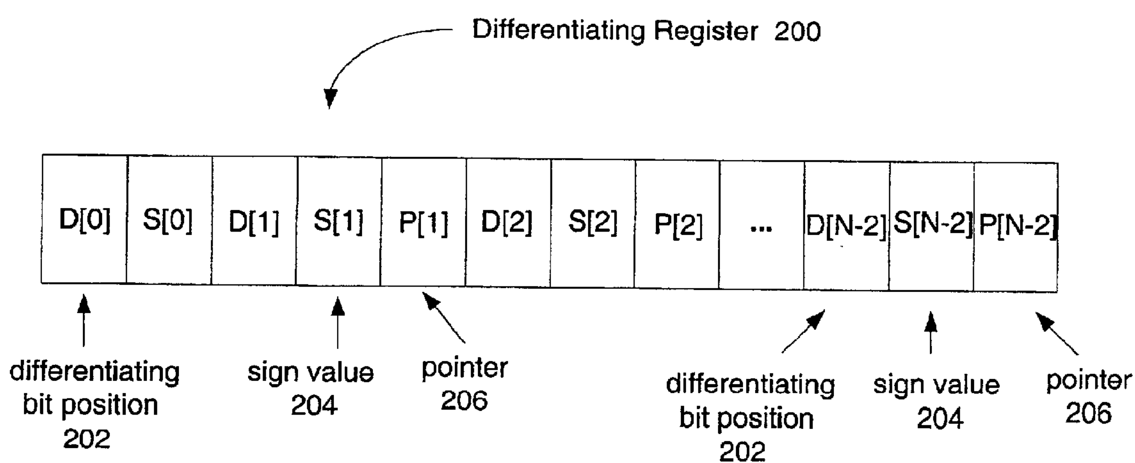
FIG. 2 illustrates a differentiating register according to an embodiment of the invention.

FIG. 1 illustrates a memory section 100 according to an embodiment of the invention. FIG. 2 illustrates a differentiating register 200 according to an embodiment of the invention. Differentiating register 200 stores information to differentiate the entries in memory section 100. During a lookup or insert in memory section 100, the differentiating information in register 200 is used to rule out all but one entry in the memory section that is most likely to match a search key. This remaining entry is then compared with the search key to see if there is a match. This provides a faster way to perform lookups and inserts, since only one entry needs to be compared to the search key.

In one embodiment of the invention, differentiating register 200 contains three types of entries: differentiating bit positions 202, reference values 204, and pointers 206. The number of differentiating bit positions, reference values, and pointers in differentiating register 200 depends on the number of entries in memory section 100. In one embodiment of the invention, memory section 100 has N number of entries, and differentiating register 200 has N-1 number of differentiating bit positions, N-1 number of reference values, and N-2 number of pointers. For reference, the differentiating bit positions are labeled D[0] to D[N-2], the reference values are labeled S[0] to S[N-2], and the pointers are labeled P[1] to P[N-2] in FIG. 2.

Each differentiating bit position indicates the position of at least one bit that is different between a pair of entries in memory section 100. For example, between a pair of entries with values 1000 and 1101, the two bits that are different are the least significant bit and the second most significant bit. For reference, the most significant bit is referred to as position one, the second most significant bit is referred to as position two, and so on. Therefore, in the example above, bit positions two and four are different. The register 200 may store the most significant bit that is different between the two entries, which in the example is bit position two. Alternatively, the register 200 may store the least significant bit that is different between the two entries, which in the example is bit position four.

Register 200 also stores a reference value 204 of the corresponding differentiating bit position between each pair of entries. One of the pair of entries is chosen as a reference entry. Register 200 may store a pointer 206 for each pair of entries to indicate which entry in the pair of entries is the reference entry. The reference value is the value of the bit in the differentiating bit position of the reference entry. For example, if 1000 is the reference entry being compared with 1101, and the differentiating bit position that is stored is the second bit position, then the reference value is 0, since the value of the second bit position of the reference entry 1000 is 0.

Figure 3:
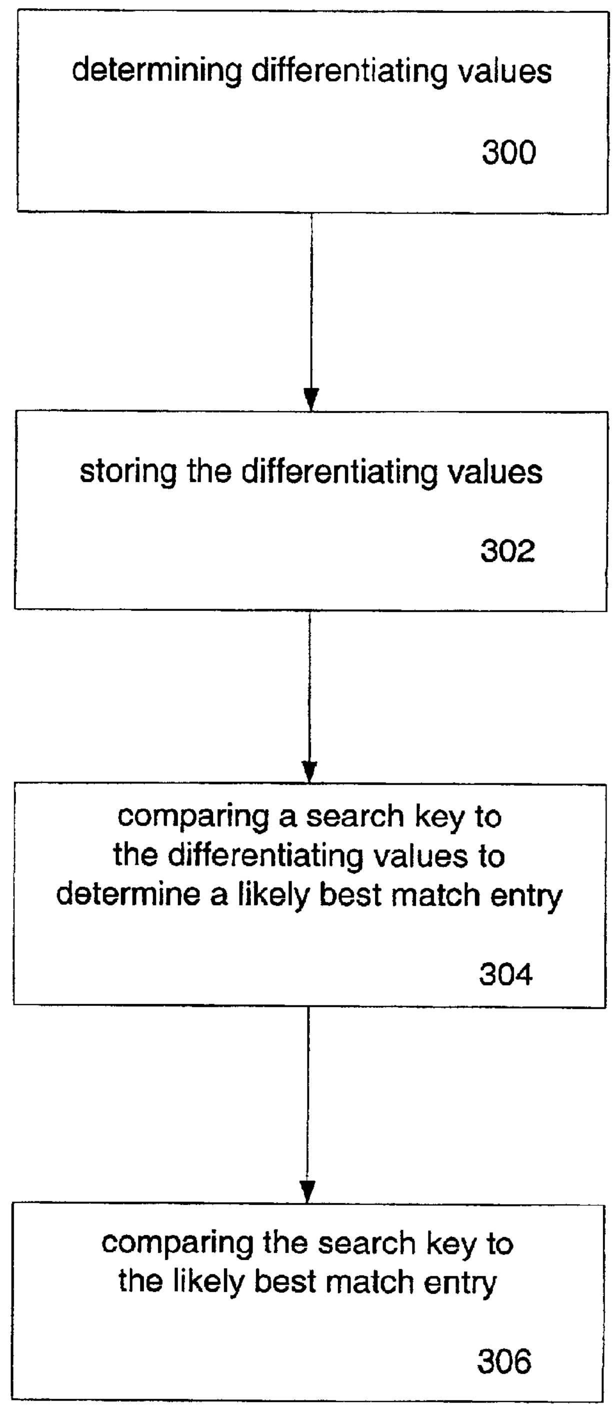
FIG. 3 illustrates a method according to an embodiment of the invention.

Referring to FIG. 3, a method according to an embodiment of the invention is illustrated. First, at 300, differentiating values are determined for pairs of entries in the memory section. In one embodiment of the invention, each differentiating value includes a differentiating bit position, a reference value, and a pointer to a reference entry. Then, at 302, the differentiating values are stored. In one embodiment of the invention, the differentiating values are stored in register 200.

Next, at 304, a search key is compared with the differentiating values to determine which entry in the memory section is most likely to match the search key. Since each differentiating value differentiates a pair of entries, one of the entries in the pair is determined to be a better match to the search key. The other entry in the pair can be ruled out as a match. This process of comparing the search key to a differentiating value in register 200 is repeated until all but one of the entries in the memory section have been ruled out. The remaining entry is the entry that is most likely to match the search key. Then, at 306, the entry determined most likely to match is retrieved from memory section 100 and compared to the search key.

In one embodiment of the invention, if there is no match between the search key and the entry determined most likely to match, the search key is inserted in the memory section. A differentiating value is then determined that differentiates the search key and the entry determined most likely to match. In one embodiment of the invention, the differentiating bit position indicates the most significant bit position that is different between the search key and the entry determined most likely to match. In one embodiment, the reference entry is the entry determined most likely to match. In this case, the reference value indicates the value of the differentiating bit position of the entry determined most likely to match, and the pointer points to the entry determined most likely to match. In one embodiment of the invention, the differentiating value that differentiates the search key and the entry determined most likely to match is stored in register 200.

Figure 4:
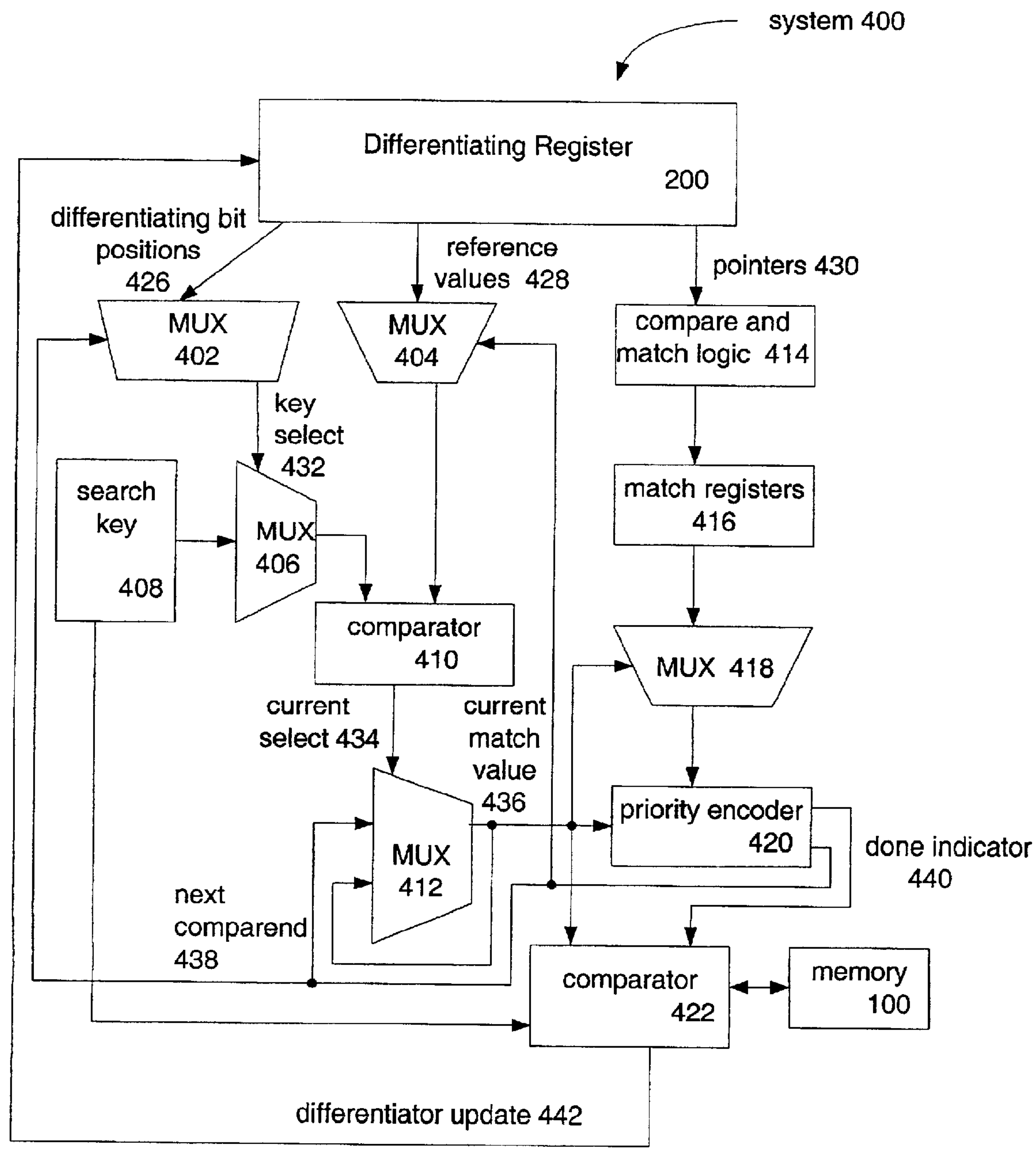
FIG. 4 illustrates a system implementing an embodiment of the invention.

Referring to FIG. 4, an embodiment of a system 400 implementing the invention is illustrated. System 400 contains differentiating register 200 and memory section 100. Differentiating register 200 maintains differentiating bit positions 426, reference values 428, and pointers 430. The differentiating bit positions 426 are input into a position selector 402. The reference values 428 are input into a reference selector 404. In one embodiment of the invention, the selectors 402 and 404 are multiplexers (MUXes). The position selector 402 selects one of the differentiating bit positions based on a next comparend 438. The reference selector 404 selects one of the reference values based on the next comparend 438. The output of the position selector 402 is a key select 432.

Search key 408 is input into a key selector 406, which selects one of the bits of the search key to input into comparator 410 based on the key select 432. The comparator 410 compares the reference value output from the reference selector 404 to the search key bit output from the key selector 406. The output of the comparator 410 is a current select 434.

The pointers 430 from differentiating register 200 are input into compare and match logic 414. The compare and match logic outputs N match registers 416, each of which is W bits wide. Each match register corresponds to an entry in the memory section and indicates which pointers point to that entry. The match register selector 418 selects one of the match registers based on a current match value 436. In one embodiment of the invention, the match register selector 418 is a multiplexer (MUX). The output of the match register selector 418 is input into priority encoder 420. The current match value 436 is also input into priority encoder 420.

The priority encoder 420 takes the bit stream output from the match register selector and outputs the first bit position in the stream that is greater than the current match value and has a bit value equal to one. This bit position output from the priority encoder is the next comparend 438. If there is no bit position that is greater than the current match value and has a bit value of 1, then the priority encoder will output a done indicator 440 of one. This indicates that all entries in the memory section have been eliminated as likely matches except the current match value. For example, if the bit stream output from the match register selector is 0010011 and the current match value is 4, then the next comparend is 6 and the done indicator is 0, since the fifth bit position is the first bit position greater than the current match value of 4 and has a bit value equal to 1. If the bit stream is 0010011 and the current match value is 7, then the done indicator is 1.

The next comparend 438 is the select for the position selector 402 and the reference selector 404, and is an input into a current match selector 412. The current match selector 412 updates the next comparend. The current match selector 412 selects between the next comparend 438 and its own output current match value 436 based on the current select 434. The current match value indicates the current entry in the memory section that is most likely to match. Any entry in the memory section that precedes the current match value entry has already been eliminated.

The system 400 cycles through at most N times to determine which one of the N entries in the memory section is most likely to match the search key 408. The system 400 cycles through each differentiating value until the done indicator goes high (or is equal to 1), which indicates that all entries in the memory section have been eliminated as matches except the current match value entry. The current match value entry is then the entry determined most likely to match the search key.

The entry most likely to match is then read from the memory section 100. A comparator 422 compares the search key to the entry determined most likely to match. If there is no match, the search key is stored in the memory section 100. One or more values to differentiate the search key and the entry determined most likely to match are determined and stored in the differentiating register 200. In one embodiment of the invention, a differentiating bit position, reference value, and pointer are stored in the differentiating register 200 to differentiate the search key and the entry determined most likely to match. If a match is found, the search key need not be stored in the memory, and no differentiating information needs to be determined and stored.

Figure 5:
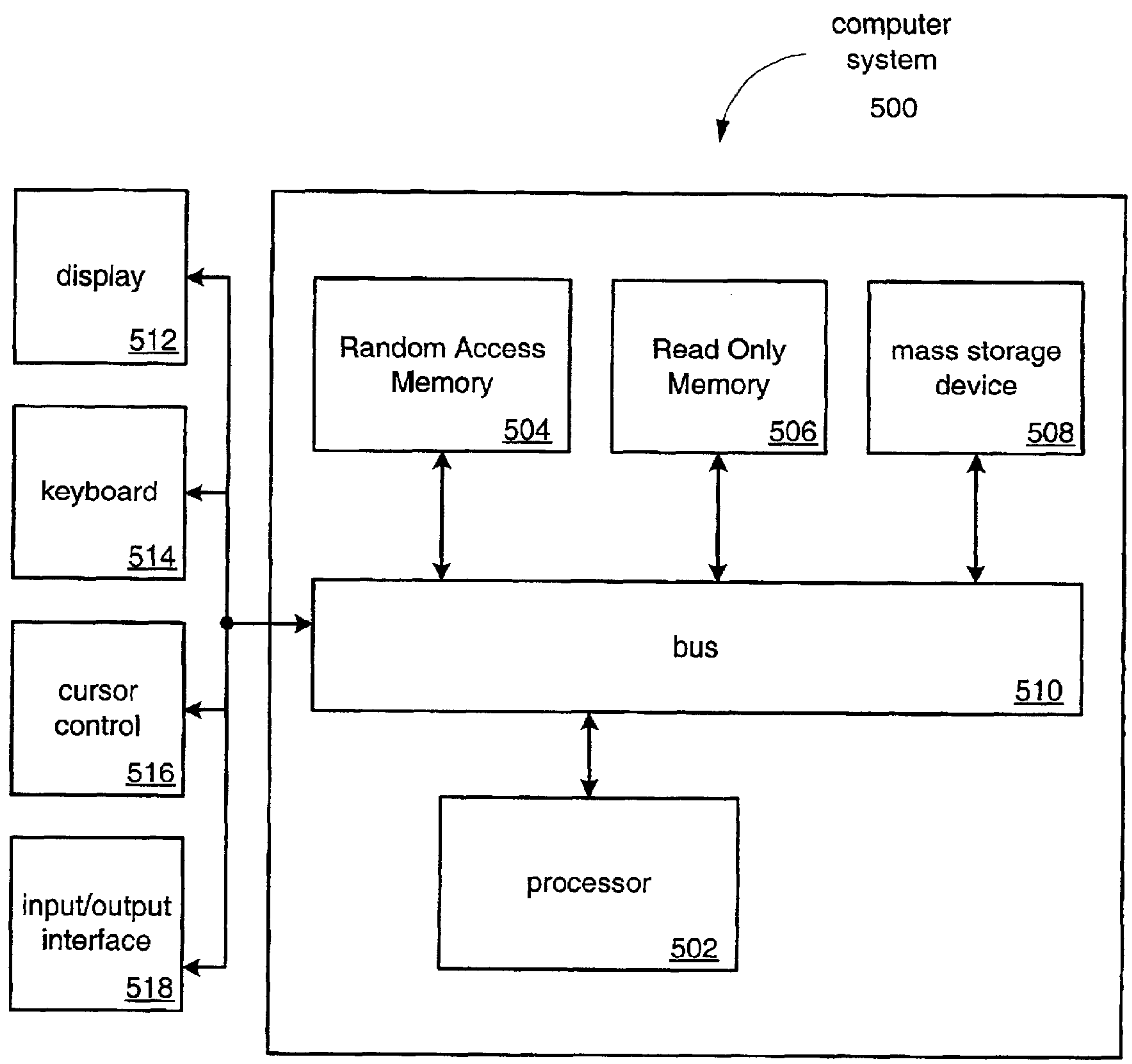
FIG. 5 is a block diagram of a computer system which may be used to implement an embodiment of the invention.

FIG. 5 illustrates a block diagram of a computer system 500 that may be used to implement an embodiment of the invention. The computer system 500 includes a processor 502 coupled through a bus 510 to a random access memory (RAM) 504, a read-only memory (ROM) 506, and a mass storage device 508. Mass storage device 508 represents a persistent data storage device, such a floppy disk drive, fixed disk drive (e.g. magnetic, optical, magneto-optical, or the like), or streaming tape drive. Processor 502 may be embodied in a general purpose processor, a special purpose processor, or a specifically programmed logic device.

Display device 512 is coupled to processor 502 through bus 510 and provides graphical output for computer system 500. Keyboard 514 and cursor control unit 516 are coupled to bus 510 for communicating information and command selections to processor 502. Also coupled to processor 502 through bus 510 is an input/output (I/O) interface 518, which can be used to control and transfer data to electronic devices (printers, other computers, etc.) connected to computer system 500.

In one embodiment of the invention, the processor 502 provides the search key 408 to system 400. In one embodiment of the invention, the memory section 100 is part of the random access memory 504 that is coupled to the processor 502 via bus 510.

It should be noted that the architecture of FIG. 5 is provided only for purposes of illustration, and that a computer used in conjunction with embodiments of the invention is not limited to this specific architecture.

An illustrative example of one embodiment the invention will now be described. For purposes of illustration, assume that there are initially no entries in memory section 100. Assume that there is a first search key of 0001010101. Since there are no entries in memory section 100, there are no possible matches, so the first search key is stored in memory section 100.

Suppose that there is a second search key of 0000110101. Since there is only one entry in memory, the entry will be retrieved and compared with the second search key. There is no match, so the second search key is stored in memory. Since there are now two entries in memory, a differentiating value is determined. The most significant bit that is different between the two entries is in the fourth bit position. Therefore, the differentiating bit position D[0]=0011. The first entry in memory section 100 has a bit value of one at the fourth bit position, so the reference value S[0]=1. The differentiating bit position and reference value are stored in the differentiating bit register 200.

Suppose that a third search key is 1111110101. The differentiating bit position D[0]=0011, so the fourth bit position of the third search key is examined, which has a bit value of 1. The reference value S[0] is 1, so between the two entries in memory section 100, the first entry is likely to be the better match to the search key. Therefore, the first entry is retrieved from memory section 100 and compared with the search key. There is no match, so the search key 1111110101 is stored in memory section 100. The most significant bit that differs between the third search key and the compared entry of 0001010101 is in the first bit position. Therefore, the differentiating bit position D[1]=0000. Since the compared entry has a bit value of 0 in the first bit position, the reference value S[1]=0. The pointer P[1]=00 to indicate that the first entry in memory section 100 was compared to the search key.

Suppose a fourth search key is 0000110000. Since D[0]=0011, the fourth bit position of the search key is examined, which has a bit value of 0. Since the reference value S[0]=1, the second entry in memory section 100 is potentially a match to the search key. Since there are no pointers to the second entry in memory, no other entries in memory section 100 have a fourth bit position with a bit value of 0. Therefore, the second entry in memory section 100 is the most likely match to the search key. The second entry is retrieved from memory section 100 and compared to the search key. There is no match, so the search key of 0000110000 is stored in memory. The most significant bit that differs between the search key and the compared entry of 0000110101 is in the eighth bit position, so the differentiating bit position D[2]=0111. The compared entry has a bit value of 1 at the eighth bit position, so the reference value S[2]=1. The pointer P[2]=01 to indicate that the second entry in memory section 100 was compared to the search key.

Suppose a fifth search key is 0111011100. Since D[0]=0011, the fourth bit position of the search key is examined, which has a bit value of 1. Since the reference value S[0]=1, the first entry in memory section 100 is potentially a match to the search key. There is a pointer pointing to the first entry, since P[1]=00, so the third entry also has a bit value of 1 at the fourth bit position and is potentially a match to the search key. Therefore, the differentiating bit position corresponding to the pointer P[1] is checked. Since D[1]=0000, the first bit position of the search key is examined, which has a bit value of 0. Since the reference value S[1]=0, the third entry is eliminated as a potential match, and the first entry is determined to likely provide the best match to the search key. There are no other pointers to the first entry, so the first entry is retrieved from memory section 100 and compared to the search key. There is no match, so the search key of 0111011100 is stored in memory. The most significant bit that differs between the search key and the compared entry of 0001010101 is in the second bit position, so D[3]=01. The compared entry has a bit value of 0 at the second bit position, so S[3]=0. The pointer P[3]=00 to indicate that the first entry in memory section 100 was compared to the search key.

Suppose that a sixth search key is 0111011000. Since D[0]=0011, the fourth bit position of the search key is examined, which has a bit value of 1. Since the reference value S[0]=1, the first entry in memory section 100 is potentially a match to the search key. There are two pointers to the first entry, since P[1]=00 and P[3]=00, so each of the two corresponding differentiating bit positions D[1] and D[3] are checked. Since D[1]=0000, the first bit position of the search key is examined, which has a bit value of 0. Since the reference value S[1]=0, the third entry is eliminated as a potential match, and the first entry is still a potential match. D[3]=01, so the second bit position of the search key is examined, which has a bit value of 1. Since S[3]=0, the first entry is eliminated as a potential match and the fifth entry is determined to likely provide the best match to the search key. There are no pointers to the fifth entry, so the fifth entry is retrieved from memory section 100 and compared to the search key. There is no match, so the search key of 0111011000 is stored in memory. The most significant bit that differs between the search key and the compared entry of 0111011100 is at the eighth position, so D[4]=0111. The compared entry has a 1 at the eighth position, so S[4]=1. The pointer P[4]=0101 to indicate that the fifth entry was compared to the search key.

Suppose that a seventh search key is 0111011100. Since D[0]=0011, the fourth bit position of the search key is examined, which has a bit value of 1. Since the reference value S[0]=1, the first entry in memory section 100 is potentially a match to the search key. There are two pointers to the first entry, since P[1]=00 and P[3]=00, so the third and fifth entries are also potential matches to the search key. Therefore, each of the two corresponding differentiating bit positions D[1] and D[3] are checked. Since D[1]=0000, the first bit position of the search key is examined, which has a bit value of 0. Since the reference value S[1]=0, the third entry is eliminated as a potential match, and the first entry is still a potential match. D[3]=01, so the second bit position of the search key is examined, which has a bit value of 1. Since S[3]=0, the first entry is eliminated as a potential match and the fifth entry is still a potential match. There is a pointer to the fifth entry, since P[4]=0101, so the sixth entry is a potential match to the search key. Therefore, the corresponding differentiating bit position D[4] is checked. D[4]=0111, so the eighth position of the search key is examined, which is a 1. Since S[4]=1, the sixth entry is eliminated as a potential match, and the fifth entry is determined to likely provide the best match to the search key. There are no other pointers to the fifth entry, so the fifth entry is retrieved from memory section 100 and compared to the search key. There is a match, so the search key is not stored in memory section 100 and no differentiating values have to be determined.

This process continues for additional lookups and inserts. By storing values to differentiate the entries in the memory, all entries except one entry determined to most likely be the best match can be eliminated for each search key. Only one entry has to be retrieved from memory section 100 and compared to the search key to determine if there is a match. This enables faster lookups and inserts.

As will be appreciated by those skilled in the art, the content for implementing an embodiment of the method of the invention, for example, computer program instructions, may be provided by any machine-readable media which can store data that is accessible by system 400, as part of or in addition to memory, including but not limited to cartridges, magnetic cassettes, flash memory cards, digital video disks, random access memories (RAMs), read-only memories (ROMs), and the like. In this regard, the system 400 is equipped to communicate with such machine-readable media in a manner well-known in the art.

It will be further appreciated by those skilled in the art that the content for implementing an embodiment of the method of the invention may be provided to the system 400 from any external device capable of storing the content and communicating the content to the system 400. For example, in one embodiment of the invention, the system 400 may be connected to a network, and the content may be stored on any device in the network.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:

storing values that differentiate entries in a section of a memory, wherein each value is associated with an entry in the section of memory and each value comprises a bit position and reference value;

comparing a search key with the values to determine which entry in the memory section is most likely to match the search key; and comparing the search key to the entry determined most likely to match the search key.

2. The method of claim 1, wherein storing values that differentiate entries comprises storing reference values, each reference value indicating the value of the bit at the bit position.

3. The method of claim 2, wherein comparing the search key with the values to determine which entry in the memory section is most likely to match comprises comparing the search key to the reference values.

4. The method of claim 1, wherein each value further comprises a pointer associated with an entry in the memory section to indicate with which other entry in the memory section the entry is being differentiated.

5. The method of claim 1, wherein each value differentiates a pair of entries in the memory section and each bit position indicates the most significant bit position that differs between the pair of entries.

6. The method of claim 5, further comprising determining the most significant bit position that differs between the search key and the entry determined most likely to match if the search key does not match the entry determined most likely to match.

7. The method of claim 6, further comprising storing the differentiating bit position and the value of the bit at the differentiating bit position of the entry determined most likely to match.

8. The method of claim 7, further comprising storing a pointer to the entry determined most likely to match.

9. The method of claim 1, further comprising storing the search key in the memory section if the search key does not match the entry determined most likely to match.

10. An apparatus comprising:

a differentiating register to store values that differentiate entries in a section of a memory, wherein each value comprises a bit position, a reference value, and a pointer;

logic coupled to the differentiating register to determine which entry is most likely to match a search key; and a comparator to compare the search key to the entry determined to most likely be a match.

11. The apparatus of claim 10, wherein the logic further determines a most significant bit that differs between the search key and the entry determined most likely to match.

12. The apparatus of claim 11, wherein the differentiating register stores the bit position and value of the most significant bit that differs between the search key and the entry determined most likely to match.

13. The apparatus of claim 12, wherein the differentiating register stores a pointer to the entry determined most likely to match.

14. An article of manufacture comprising:

a machine accessible medium including content that when accessed by a machine causes the machine to:

store values to differentiate entries in a section of a memory, each value comprising a bit position and a reference value;

compare a search key with the differentiating values to determine which entry in the section is most likely to match; and compare the search key to the entry determined most likely to match.

15. The article of manufacture of claim 14, further comprising machine accessible medium including content that when accessed by a machine causes the machine to determine a most significant bit that differs between the search key and the entry determined most likely to match if the search key does not match the entry determined most likely to match.

16. The article of manufacture of claim 15, further comprising a machine accessible medium including content that when accessed by a machine causes the machine to store the bit position and value of the most significant bit that differs between the search key and the entry determined most likely to match.

17. The article of manufacture of claim 16, further comprising a machine accessible medium including content that when accessed by a machine causes the machine to store a pointer to the entry determined most likely to match.

18. The article of manufacture of claim 14, further comprising a machine accessible medium including content that when accessed by a machine causes the machine to store the search key in the memory section if the search key does not match the entry determined most likely to match.

19. A system comprising:

a memory;

a processor coupled to the memory via a bus;

a differentiating register coupled to the memory to store values that differentiates entries in a section of the memory, wherein each value comprises a bit position and reference value; and logic coupled to the memory and the differentiating register to determine which entry is most likely to match a search key and to compare the search key to the entry determined most likely to match.

20. The system of claim 19, wherein the differentiating register further stores a pointer to the entry determined most likely to match.

21. The system of claim 20, wherein the logic further determines a most significant bit that differs between the search key and the entry determined most likely to match.

22. The system of claim 21, wherein the differentiating register further stores the bit position and value of the most significant bit that differs between the search key and the entry determined most likely to match.

23. A method comprising:

determining a first differentiating value between two entries in a section of a memory, wherein the first differentiating value comprises a differentiating bit position and differentiating reference value;

storing the first differentiating value; and examining the first differentiating value to determine which of the two entries is likely to better match a search key.

24. The method of claim 23, further comprising comparing the search key to one of the two entries that is determined likely to be a better match.

25. The method of claim 24, further comprising storing the search key in the memory section if the search key does not match the entry determined likely to be a better match.

26. The method of claim 25, further comprising determining a second differentiating value between the search key and the entry determined likely to be a better match if the search key does not match the entry determined likely to be a better match.

27. The method of claim 26, further comprising storing the second differentiating value.

28. The method of claim 27, further comprising storing a pointer that points to the entry determined likely to be a better match.

29. The method of claim 28, further comprising examining the first and second differentiating values to determine which entry is likely to be a best match to a second search key and comparing the second search key to the entry determined to likely be the best match.

* * * * *